United States Patent (12) United States Patent
McCormick et al.

(10) Patent No.: US 6,867,539 B1
(45) Date of Patent: Mar. 15, 2005

(54) ENCAPSULATED ORGANIC ELECTRONIC DEVICES AND METHOD FOR MAKING SAME

(75) Inventors: Fred Boyle McCormick, Maplewood, MN (US); Paul Frederic Baude, Maplewood, MN (US); George David Vernstrom, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 447 days.

(21) Appl. No.: 09/614,993

(22) Filed: Jul. 12, 2000

(51) Int. Cl.$^7$ .............................. H01J 1/62; H01J 63/04

(52) U.S. Cl. ...................... 313/504; 313/506; 313/512; 257/86; 257/94; 257/40

(58) Field of Search .............................. 313/504, 506, 313/507, 498, 503, 512; 257/86, 94, 103, 40

(56) References Cited

U.S. PATENT DOCUMENTS

| | | | |
|---|---|---|---|
| 3,621,321 A | 11/1971 | Williams et al. | 313/108 A |
| 3,995,299 A | 11/1976 | Partridge | 357/8 |
| 4,862,827 A | 9/1989 | Getson | 118/620 |
| 4,913,930 A | 4/1990 | Getson | 427/58 |
| 5,061,549 A | 10/1991 | Shores | 428/207 |
| 5,061,657 A | 10/1991 | Queen et al. | 437/219 |
| 5,112,882 A | 5/1992 | Babu et al. | 522/158 |
| 5,189,405 A | 2/1993 | Yamashita et al. | 340/781 |
| 5,362,421 A | 11/1994 | Kropp et al. | 252/512 |
| 5,516,577 A * | 5/1996 | Matsuura et al. | 428/212 |
| 5,593,794 A | 1/1997 | Wei et al. | 429/91 |
| 5,607,789 A | 3/1997 | Treger et al. | 429/90 |
| 5,652,067 A | 7/1997 | Ito et al. | 428/690 |
| 5,681,666 A | 10/1997 | Treger et al. | 429/90 |
| 5,682,066 A | 10/1997 | Gamota et al. | 257/783 |
| 5,686,360 A | 11/1997 | Harvey, III et al. | 437/211 |
| 5,725,909 A | 3/1998 | Shaw et al. | 427/412.1 |
| 5,734,225 A | 3/1998 | Biebuyck et al. | 313/512 |

(List continued on next page.)

FOREIGN PATENT DOCUMENTS

| | | |
|---|---|---|
| EP | 0 762 806 A2 | 3/1997 |
| EP | 0 777 281 A2 | 6/1997 |
| EP | 0 827 366 A2 | 3/1998 |
| EP | 0 851 714 A2 | 7/1998 |
| EP | 0 858 100 A1 | 8/1998 |
| EP | 0 884 930 A1 | 12/1998 |
| EP | 0 977 469 A2 | 2/2000 |
| EP | 1 021 070 A1 | 7/2000 |
| JP | 07282975 A | 10/1995 |
| JP | 10-57214 | 3/1998 |
| WO | WO 97/31508 | 8/1997 |
| WO | WO 97/43352 | 11/1997 |
| WO | WO 99/21708 | 5/1999 |
| WO | WO 00/05929 | 2/2000 |
| WO | WO 00/26973 | 5/2000 |
| WO | WO 00/36665 | 6/2000 |
| WO | WO 00/41893 | 7/2000 |

OTHER PUBLICATIONS

Article: Affinito et al., "PML/Oxide/PML Barrier Layer Performance Differences Arising From Use of UV or Electron Beam Polymerization of the PML Layers," *Thin Solid Films*, 308–309, 1997, pp. 19–25.

*Primary Examiner*—Joseph Williams
*Assistant Examiner*—Kevin Quarterman (57) ABSTRACT

Encapsulated organic electronic devices including organic light emitting diodes are made using an adhesive component as a mask while the device is being constructed. An adhesive-coated liner can be applied to the device substrate and openings created therein by removing portions of the linear and adhesive, or a patterned adhesive layer having openings therein can be formed on the device substrate, followed by deposition of the device layers and application of a sealing layer.

15 Claims, 5 Drawing Sheets

U.S. PATENT DOCUMENTS

| | | |
|---|---|---|
| 5,739,545 A | 4/1998 | Guha et al. .................... 257/40 |
| 5,744,557 A | 4/1998 | McCormick et al. ....... 526/171 |
| 5,757,126 A | 5/1998 | Harvey, III et al. ......... 313/506 |
| 5,786,664 A | 7/1998 | Liu ............................. 313/506 |
| 5,804,917 A * | 9/1998 | Takahashi et al. ........... 313/504 |
| 5,811,177 A | 9/1998 | Shi et al. .................... 428/209 |
| 5,821,692 A | 10/1998 | Rogers et al. ............... 313/512 |
| 5,830,028 A | 11/1998 | Zovko et al. ................. 445/24 |
| 5,844,363 A | 12/1998 | Gu et al. .................... 313/506 |
| 5,855,994 A | 1/1999 | Biebuyck et al. ........... 428/209 |
| 5,858,564 A | 1/1999 | Tamura et al. ............... 428/690 |
| 5,874,804 A | 2/1999 | Rogers ........................ 313/512 |
| 5,895,228 A | 4/1999 | Biebuyck et al. .............. 438/99 |
| 5,896,006 A | 4/1999 | Kusaka et al. ............... 313/506 |
| 5,904,961 A | 5/1999 | Tang et al. .................. 427/561 |
| 5,965,979 A | 10/1999 | Friend et al. ................ 313/504 |
| 5,998,085 A | 12/1999 | Isberg et al. ................. 430/200 |
| 6,114,088 A | 9/2000 | Wolk et al. .............. 430/273.1 |
| 6,140,009 A | 10/2000 | Wolk et al. ................. 430/200 |
| 6,218,774 B1 * | 4/2001 | Pope .......................... 313/461 |

* cited by examiner

ENCAPSULATED ORGANIC ELECTRONIC DEVICES AND METHOD FOR MAKING SAME

TECHNICAL FIELD

This invention relates to a method for making an encapsulated organic electronic device.

BACKGROUND

Organic electronic device (OED)s are articles that include layers of organic materials, at least one of which can conduct an electric current. Illustrative examples of known OED constructions include photovoltaic devices, rectifiers, transmitters, and organic light emitting diodes (OLED)s.

An organic light emitting diode (OLED) is a typical example of an OED. OLEDs, sometimes referred to as lamps, are desirable for use in electronic media because of their thin profile, low weight, and low driving voltage, i.e., less than about 20 volts. OLEDs have potential use in applications such as backlighting of graphics, pixelated displays, and large emissive graphics.

OLEDs typically consist of an organic light emitter layer and additional organic charge transport layers on both sides of the emitter, all of which are sandwiched between two electrodes: a cathode and an anode. The charge transport layers comprise an electron transporting layer and a hole transporting layer. Charge carriers, i.e., electrons and holes, are injected into the electron and hole transporting layers from the cathode and anode, respectively. Electrons are negatively charged atomic particles and holes are vacant electron energy states that behave as though they are positively charged particles. The charge carriers migrate to the emitter layer, where they combine to emit light.

Examples of OLEDs include molecularly doped polymer devices where charge carrying and/or emitting species are dispersed in a polymer matrix (see J. Kido, "Organic Electroluminescent devices Based on Polymeric Materials," *Trends in Polymer Science,* 1994, 2, 350–355), conjugated polymer devices where layers of polymers such as poly (phenylenevinylene) act as the charge carrying and emitting species (see J. J. M. Halls, D. R. Baigent, F. Cacialli, N. C. Greenham, R. H. Friend, S. C. Moratti, and A. B. Holmes, "Light-emitting and Photoconductive Diodes Fabricated with Conjugated Polymers," *Thin Solid Films,* 1996, 276, 13–20), vapor deposited small molecule heterostructure device (see U.S. Pat. No. 5,061,569, incorporated by reference, and C. H. Chen, J. Shi, and C. W. Tang, "Recent Developments in Molecular Organic Electroluminescent Materials," *Macromolecular Symposia,* 1997, 125, 1–48), light emitting electrochemical cells (see Q. Pei, Y. Yang, G. Yu, C. Zang, and A. J. Heeger, "Polymer Light-Emitting Electrochemical Cells: In Situ Formation of Light-Emitting p-n Junction," *Journal of the American Chemical Society,* 1996, 118, 3922–3939), vertically stacked organic light-emitting diodes capable of emitting light of multiple wavelengths (see U.S. Pat. No. 5,707,745, incorporated by reference, and Z. Shen, P. E. Burrows, V. Bulovic, S. R. Forrest, and M. E. Thompson, "Three-Color, Tunable, Organic Light-Emitting Devices," *Science,* 1997, 276, 2009–2011).

Essentially all organic light emitting materials, organic charge transport materials and organic hole transport materials are adversely affected by heat, light, oxygen, and moisture. The low work function meal cathodes typically used in OLEDs are also sensitive to oxygen and moisture, which can cause corrosion and failure of the cathode. It is important, therefore, to protect these layers from exposure to the open air. Some methods of making OEDs such as OLEDs partially protect these layers, for example, methods that use barrier films as substrates, but the top layer of the OLED remains exposed. A separate encapsulation step, such as bonding a metal cap on top of an OLED, is typically required. This separate encapsulation step adds to manufacturing complexity and is not generally suited to the fabrication of flexible OLEDs.

SUMMARY OF INVENTION

The present invention describes a novel protected OED and a novel method of making a protected OED. The method of the present invention protects the applied layers of an OED from exposure to the open air, particularly during manufacture of an OLED, in order to assure the maximum possible lifetime of the device.

In one aspect, the present invention provides a method for making an organic electronic device comprising:
  providing an adhesive-coated release liner from which a pattern has been cut,
  applying the adhesive-coated side of the patterned release liner to an electrode substrate to form a composite structure having at least a portion of the electrode substrate exposed,
  depositing one or more organic electronic elements on the exposed electrode of the composite structure,
  removing the release liner from the composite structure, and
  adhering a sealing layer to the exposed adhesive of the composite structure.

In another aspect, the invention provides a method for making an organic electronic device comprising:
  coating an adhesive in a pre-determined pattern on an electrode substrate to form a composite structure wherein areas of the substrate remain exposed;
  optionally at least partially curing, or drying, the adhesive;
  applying a liner mask to the patterned adhesive such that at least a portion of the exposed substrate areas remain exposed;
  depositing one or more organic electronic elements on the masked composite structure;
  removing the liner mask from the adhesive; and
  applying a sealing layer.

In yet another aspect, the invention provides an article comprising an organic electronic device wherein the layers between the anode and cathode are surrounded by an adhesive layer and wherein the circumference of the adhesive layer is equal to the circumference of one or both of the electrode substrate or sealing layer.

In another aspect, the present invention provides a method for making an OED such as an OLED wherein an encapsulating component, which is incorporated into the OED structure, also serves as a mask while the OED is being constructed. Pursuant to one aspect of the present invention, an adhesive-coated liner, having openings cut through it in the desired shape of the OED, is applied, adhesive side down, to the OED substrate.

In another aspect of the invention, the adhesive may be precisely applied to the OED substrate in a liquid form, e.g., by an inkjet printing method or screen printing. One or more solid liner layers, having openings complementary to the openings in the adhesive layer may then be applied. After this step, the desired element layers of the OED are sequentially deposited onto the liner/adhesive/substrate composite structure. Once all the desired OED layers have been applied, the liner is removed from the adhesive, leaving complete or substantially complete OED structures surrounded by an adhesive structure.

In yet another aspect of the invention, an OED may be an OLED. The present invention will allow an OLED to be constructed from the anode or cathode side. In either case, a sandwich structure can be made by applying the adhesive layer to an electrode layer then depositing the OLED elements in the order necessary to construct an OLED.

In a further aspect, the OLED may be partially constructed on each electrode substrate and the final operational OLED obtained by laminating the two partial lamps together. The sandwich structure would be attained by first applying the adhesive/liner layer on one or both electrode substrates and depositing, for example, hole transport material onto the anode substrate and electron transport and emitter material on the cathode substrate and subsequently aligning and laminating said films together with heat and/or pressure. The final OLED device can have enhanced structural stability over other types of laminated OLED devices due to the adhesive forming the in situ edge seal.

In some embodiments, it may be preferable to have the organic OLED elements coated over an area larger than the underlying electrode layer. Having the organic layers cover a larger area than the electrode helps avoid electrical shorting.

After the OLED organic layers have been applied, a counter electrode is applied. If the counter electrode is a cathode, the electrode may comprise a sheet of electrically conductive material, e.g., aluminum, that is placed on the adhesive structure to form a sealing layer, thereby encapsulating each OLED device. If the counter electrode is an anode, the electrode may comprise a sheet of electrically conductive material, e.g., ITO on a polymer film substrate, that is placed on the adhesive structure to form a sealing layer, thereby encapsulating each OLED device. If the sealing layer is a counter electrode, it must touch the entire top organic element layer to provide illumination of the total area of the OLED device. In these cases, the counter electrode will also act as a barrier to water and air. Alternatively, the counter electrode may be deposited within the boundaries of the adhesive structure and a protective material may be placed on top of the adhesive structure, thereby encapsulating each OLED device. The protective layer may be conducting or non-conducting. If it is conducting, it may be used as a conducting lead, and it must touch at least one point of the adjacent electrode layer. The resulting sheet of OLED devices may then be cut in patterns defined by the adhesive portion, thereby providing individual OLED devices, each of which is encapsulated between two substrates that are edge sealed by an adhesive.

As used in this invention:

"partially cure" means increasing the viscosity of a composition to induce film formation or reduce creep or flow, i.e., wherein the physical state of the composition is altered, such as by transforming from a fluid to less fluid state, going from a tacky to a non-tacky state, going from a soluble to insoluble state, or decreasing the amount of polymerizable material by its consumption in a chemical reaction.

An advantage of at least one embodiment of the present invention is that it allows an OED to be made without exposure to the atmosphere at any time during the process, for example by conducting the deposition steps in a vacuum.

Another advantage of at least one embodiment of the present invention is that it allows for encapsulated OEDs to be made on a continuous basis.

Another advantage of at least one embodiment of the present invention is that it provides an OED having structural stability.

Another advantage of at least one embodiment of the present invention is that because the OED is not exposed to the atmosphere while being constructed, air and water sensitive materials can be used in the OED.

Another advantage of at least one embodiment of the present invention is that OEDs can easily be made in any desired shape.

Another advantage of at least one embodiment of the present invention is that OEDs can be made continuously in a roll-to-roll process.

Another advantage of at least one embodiment of the present invention is that OEDs may be made on a flexible substrate as compared to conventional methods that require a rigid substrate.

Although the invention described herein may be used for a wide variety of OED devices, for illustrative purposes, only OLEDs will be discussed in detail.

Other features and advantages of the invention will be apparent from the following drawings, detailed description, and claims.

The present invention is susceptible to various modifications and alternative forms. Some specifics thereof have been shown by way of example in the drawing and will be described in detail. It should be understood, however, that the invention is not to limit the invention to the particular embodiments described. On the contrary, the intention is to cover all modifications, equivalents, and alternatives falling within the spirit and scope of the invention as described by the following detailed description and as defined by the appended claims.

DETAILED DESCRIPTION

The present invention can provide a robust OED device by means of in situ edge sealing thereby enhancing structural integrity and device lifetime. The edge sealing is provided by using an adhesive component applied to a substrate prior to OED element deposition.

In one OED embodiment of the present invention, a thin layer of an adhesive (pressure sensitive adhesive, hot melt, or curable) is applied to a release liner, openings are cut in the adhesive/liner composite, then the composite is adhered to an electrode-coated substrate. Alternatively, an adhesive may be applied directly onto the electrode-coated substrate, e.g., by printing in a desired pattern, optionally partially cured or dried, then covered with one or more liners that act as a mask during deposition of the OLED elements. The OLED elements may be applied in one or more patterns (circles, rectangles, letters, numbers, bar code and so forth) through openings in the liner and the adhesive. If multiple masks having different sizes or shapes are used, the OLED element layers may be applied in different or overlapping areas of the opening, depending on when each mask is removed during the deposition process. Alternatively, the elements may be deposited through an additional mask placed over the openings, which results in thin film deposition in a different, typically smaller, pattern than that defined by the adhesive liner mask described above. Another method would be to prepare a blank liner with a patterned adhesive, then die cut openings complementary to the adhesive pattern in the liner to allow deposition of OLED elements once the adhesive/liner is placed on the substrate.

Examples of suitable adhesives include pressure sensitive adhesives (PSA) made from acrylates such as Ultra-Clean Laminating Adhesive 501FL and Optically Clear Laminating Adhesive 8141 both available from 3M Bonding Systems Division, St. Paul, Minn., rubbers such as KRATON styrenic block copolymers from Shell Chemicals, Houston, Tex., silicones such as RHODOTAK 343 from Rhodia Silicones, Lyon, France, and polyolefins such as poly(1-hexene), poly(1-octene), and poly(4-ethyl-1-octene) described in U.S. Pat. No. 5,112,882; hot melt adhesives such as unfilled versions of the tackified polyamide-polyether copolymers described in U.S. Pat. No. 5,672,400 and the thermoplastic polymer adhesive films described in U.S. Pat. No. 5,061,549; curable adhesives, thermosets, and crosslinking systems such as the unfilled versions of the epoxy/thermoplastic blends described in U.S. Pat. No. 5,362,421; the cyanate ester/ethylenically unsaturated semi-IPNs described in U.S. Pat. No. 5,744,557; the epoxy/acrylate compositions described in WO 97/43352; two-part epoxies like ARALDITE 2011 from Ciba Specialty Chemicals, Brewster, N.Y.; and UV curing resins like the Series 3100 adhesives from Three Bond of America, Inc., Torrance, Calif. Various combinations of pressure sensitive adhesive, hot melt, and curable adhesives may be useful in the practice of the invention.

The adhesive may be filled with various particulates and fillers to provide special functionality such as controlling the bond line thickness, providing electrical or thermal conductivity, or desiccating the interior of the packaged OLED device. Filled adhesives would include thermally conductive adhesive such as 9882 Thermally-Conductive Adhesive Transfer Tape available from 3M Bonding Systems Division; electrically conductive adhesives such as 9703 Conductive Adhesive Transfer Tape, 5303R -Axis Adhesive Film, and 7303 Z-Axis Adhesive Film, all of which are available from 3M Bonding Systems Division; and desiccant filled adhesives such as DESIMAX SLF Hot Melt films available from Multisorb Technologies Inc., Buffalo, N.Y. Filled adhesives may be used in conjunction with unfilled adhesives.

The adhesives may be applied to a release liner by any suitable coating method such as knife coating, extrusion, offset coating, spray coating, and curtain coating. The thickness of the adhesive will depend on the desired thickness of the finished product. Typical thicknesses for the adhesive structures range from about 500 to 0.05 micrometers. Thicknesses above or below this range may also be used as desired to suit the application.

Suitable release liner materials include polypropylene and fluoropolymer films, polymer films, such as polyester, coated with siloxanes or fluorocarbons, paper coated with siloxanes or fluorocarbons, metal foils coated with siloxanes or fluorocarbons, and metallized polymer films, such as metallized polyester, coated with siloxanes or fluorocarbons. The choice of liner will be dependent on its compatibility with subsequent processing steps.

Patterns may be cut through the adhesive-coated liner by die cutting, laser cutting or other precision cutting methods such as kiss cutting. The patterns may be any desired shape. More than one shape may be cut into a single sheet of adhesive-coated liner. Additionally, the shapes and sizes of material removed from the adhesive and liner need not be the same. For example, a square area may be removed from the adhesive layer while a smaller star-shaped area of the liner, located within the square area of the removed adhesive, may be removed from the liner layer such that after the OLED layers have been deposited through the star-shaped opening in the liner, a gap exists between the finished star-shaped OLED and the surrounding adhesive structure.

Figure 10:
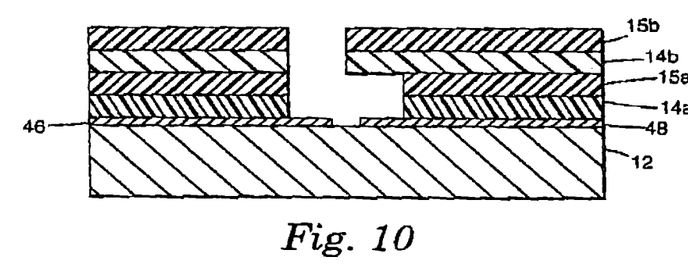
FIG. 10 illustrates the use of multiple adhesive/liner pairs of different sizes and shapes in OED fabrication.

As shown in FIG. 10, multiple layers of adhesives and liners may be used where each adhesive/liner layer has differently shaped openings to allow depositions in different areas at different stages of the fabrication process. Adhesive/liner mask layers 14a, 15a closest to the deposition substrate will typically have a larger opening than adhesive/liner mask layers 14b, 15b placed on top of layers 14a, 15a. In FIG. 10, the organics for an OLED would be deposited onto ITO anode 46 with both adhesive/liner masks in place. Adhesive/liner mask layers 14b, 15b would then be removed and the cathode would be deposited through adhesive/liner mask layers 14a, 15a. Liner 15a would be removed and replaced with a protective layer. The cathode would thus contact the ITO cathode pad 48 without any electrical shorts to the ITO anode 46. Attaching the anode lead 46 and cathode lead 48 to a power supply would allow the final encapsulated OLED to operate. Adhesive/liner mask layers 14b, 15b could be removed after depositing one set of organic layers and be replaced by different adhesive/liner mask layers that had a different size or shape mask opening than adhesive/liner mask layers 14b, 15b. This would allow for more complex deposition patterns to be obtained, such as those required for multi-color devices. This could be particularly effective in a roll-to-roll process.

Figure 1:
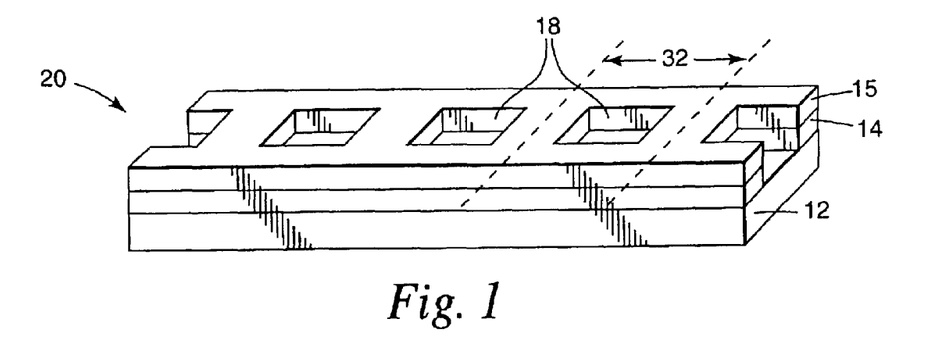
FIG. 1 illustrates the substrate with the applied adhesive-coated liner mask.

The patterned adhesive-coated liner may be applied by any convenient method, e.g., lamination methods such as hot, cold, pressure, and vacuum lamination, to a substrate thereby forming a mask on the substrate. FIG. 1 illustrates a substrate 12 having a patterned transfer adhesive 14 with liner mask 15. Transfer adhesive 14 and liner mask 15 both have openings 18 that extend through to substrate 12. Cut lines 32 exemplify the location at which the finished sheet of devices will be singulated.

An alternative method of applying an adhesive layer to the substrate is to deposit a liquid adhesive by precision methods such as ink jet or screen printing in a desired pattern thereby leaving areas of substrate exposed, optionally partially curing or drying the adhesive to reduce flow and prevent adhesive migration, then covering the adhesive with a solid film liner layer than has complementary patterned openings. By this method, the openings in the liner mask may be made bigger or smaller than the underlying exposed substrate area. The ability to make the liner mask and OLED structure different sizes can be advantageous. For example, to prevent electrical shorting it may be advantageous to make the interior OLED elements cover a larger area than the bottom and/or top electrode so the electrodes do not touch. In other instances, it may be preferable to make the mask openings smaller than the electrodes.

Figure 11:
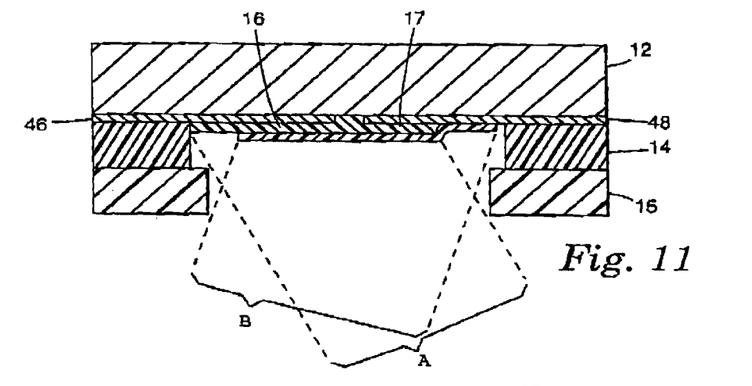
FIG. 11 illustrates the use of adhesive and liner layers of different sizes in conjunction with directional layer deposition to control the area on which various deposited layers are applied.

FIG. 11 shows another construction method to avoid electrical shorting in an OLED. The method comprises evaporating, for example, organic layers 16, from direction A, and cathode layers 17, from direction B, onto substrate 12 which is coated with ITO anode 46 and ITO cathode pad 48. The shadowing effects of adhesive/liner mask 14/15 would allow for selective deposition of organic and cathode layers near the edges of the mask. This may be particularly effective when the opening in adhesive 14 is larger than the opening in liner 15.

Once adhesive/liner mask 14/15 is applied, one or more OLED elements may be deposited onto the masked substrate by any suitable coating method such as vacuum deposition, solution coating, and thermal transfer. These coating methods are further described in copending patent application U.S. Ser. No. 09/389,926, pp. 7–10, which application is incorporated by reference. The layers of individual OLED elements may be from about 200 to about 5000 Å thick. In some cases, the thickness of the combined layers is approximately equal to the thickness of adhesive layer 14, for example when the final applied film is a metal foil that is a cathode or that makes electrical contact with the cathode layer. Having the thicknesses of the adhesive and OLED element layers be equal is also preferable when the adhesive does not flow much during bonding. This is typically true of pressure sensitive adhesives. However, when the adhesive flows well during bonding, as is typical with hot melt or curable adhesives, the thickness of the bond line, i.e., the final thickness of the adhesive when the bond is complete, can be controlled by adjusting the curing chemistry and the bonding conditions, which control the flow of the adhesive, or by adding filler particles of a specified size, which thereby define the bond line thickness. Methods known in the art can be used to control the flow of the adhesive to obtain such adjustments. In such a case, the thickness of the adhesive may be greater than that of the OLED element layers.

Figure 6:
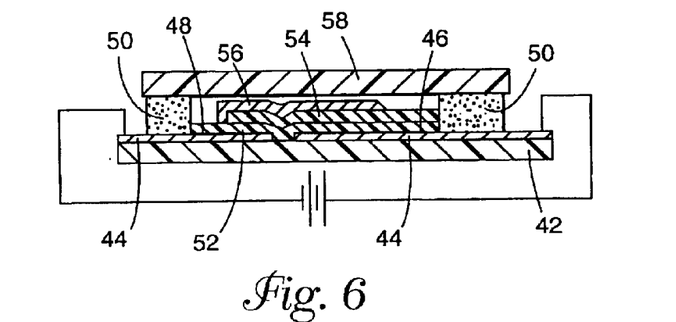
FIG. 6 illustrates a cross-sectional view of an OLED construction made using the present invention.
Figure 7:
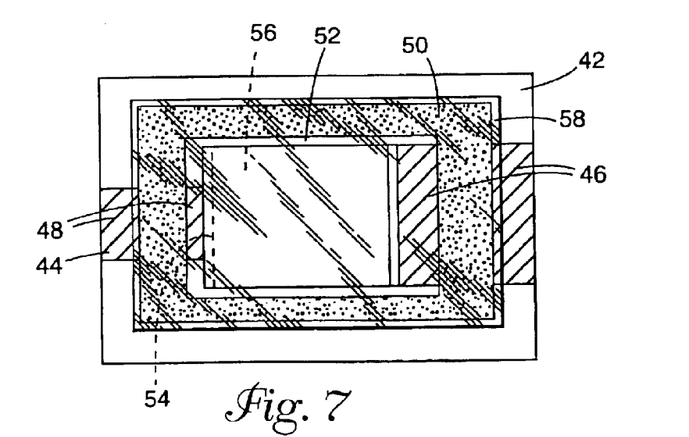
FIG. 7 illustrates a top view of the OLED of FIG. 6.

A preferred encapsulated OLED structure may have conducting lead, such as indium tin oxide (ITO) leads 44 extending under the bond line and making electrical contact with the anode 46 and cathode 56 as shown in FIGS. 6 and 7. In this case, the encapsulating film, i.e., the final top layer, would not need to act as an electrical contact. In some embodiments, leaving a gap between the protective layer 58 and OLED, as is shown in FIGS. 6 and 7 may be desirable, for example when including a desiccant in the gap or when protecting the OLED from abrasion is desired. This may be achieved by having the adhesive layer 50 substantially thicker than the OLED element layers 52, 54, 56.

The OLED element coating process may be conducted in a controlled atmosphere such as nitrogen, argon, or vacuum. This conveniently allows OLEDs to be made with air- and water-sensitive materials such as the electroluminescent materials comprising OLEDs as described herein. The process allows the production of an encapsulated OLED that has not been contaminated by exposure to air. Subsequent lamination of the coated substrate to a sealing layer may provide a finished OLED that is edge-sealed and has enhanced structural stability.

The suitability of a particular counter electrode, which may be used as a sealing layer, will depend on the desired application and the other OLED elements. Examples of cathode counter electrode materials include calcium, lithium, aluminum, ITO, barium, ytterbium, samarium, magnesium/silver alloys, and multiple layer structures such as calcium/aluminum and copper phthalocyanine/ITO. Examples of anode counter electrode materials include ITO and gold. It is preferred that at least one counter electrode be transparent. Alternatively, the counter electrode may be coated onto the OLED construction as are the other OLED elements, after which a protective layer may be laminated over the counter electrode layer.

A sealing protective layer for an OLED may comprise, e.g., dielectric/polymer and metal/polymer layered composite films (sometimes referred to as polymer multilayer, or PML, films) such as those described in WO 00026973, U.S. Pat. No. 5,725,909, U.S. Pat. No. 4,954,371, and *Thin Solid Films*, 1997, 308–309, 19–25, metal foils, metallized polymer films, dielectric coated polymer films such as $SiO_x$ coated polymer films (TECHBARRIER S available from Mitsubishi Chemical Corporation, Tokyo), thin flexible glass such as 0.03 mm thick D 263 T glass available from Schott Displayglas GmbH, Mainz, Germany, and thin glass adhesively laminated to polymer films as described in WO 99/21708, metal plates, glass plates, plastic plates, and fluoropolymer films such as ACLAR films available from Allied Signal Inc., Specialty Films, Pottsville, Pa. Rigid protective layers, such as metal, glass, or plastic plates, may be more suited for batch OLED manufacturing processing. Flexible barrier films, such as thin glass, multilayer polymer films, such as those described in U.S. Pat. No. 4,954,371, metal foils, and metallized polymers may be performed in many instances because they can be used in a roll-to-roll process as well as in a batch process. Depending on the intended use of the OLED, the protective layer need not necessarily be transparent or conducting.

Figure 2:
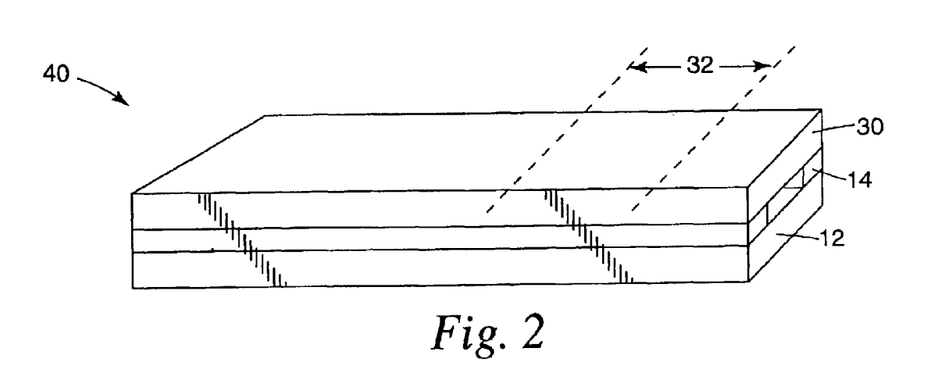
FIG. 2 illustrates the final sheet of OLED devices after the OLED elements have been deposited, the liner has been removed, and the sealing layer has been applied to the exposed transfer adhesive. Lines where cuts can be made to convert the sheet of OLED devices into individual device (i.e., singulate) are also shown.
Figure 3:
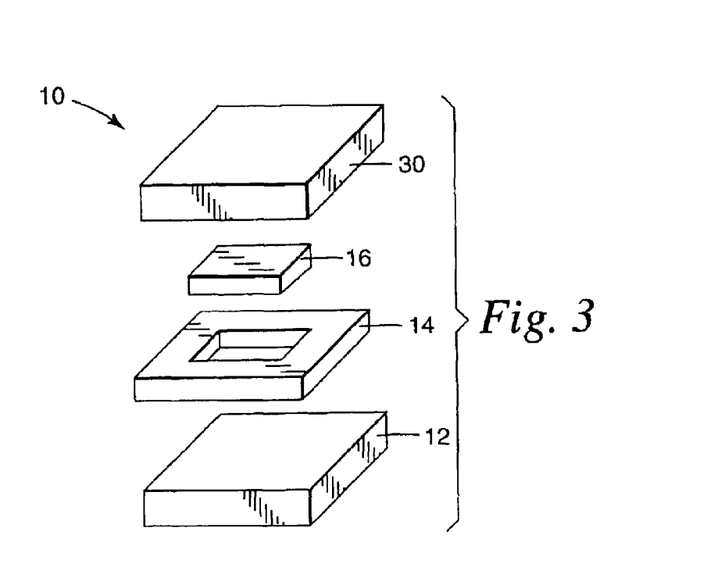
FIG. 3 illustrates an exploded view of the components of an organic electronic device made by a method of the present invention.

FIG. 2 illustrates an embodiment of an OLED construction after sealing layer 30 has been applied. An exploded view of an exemplary individual OLED structure made by the foregoing method is shown in FIG. 3. Adhesive 14 on substrate 12 surrounds OLED elements 16. Sealing layer 30 forms the top layer of OLED construction 10. Cut lines 32 indicate where the structure can be cut through the layer of sealing layer 30, transfer adhesive 14 and substrate 12 to provide individual OLEDs 10 such that the OLED elements 16 are encapsulated by adhesive 14 and sandwiched between substrate 12 and sealing layer 30.

Figure 5:
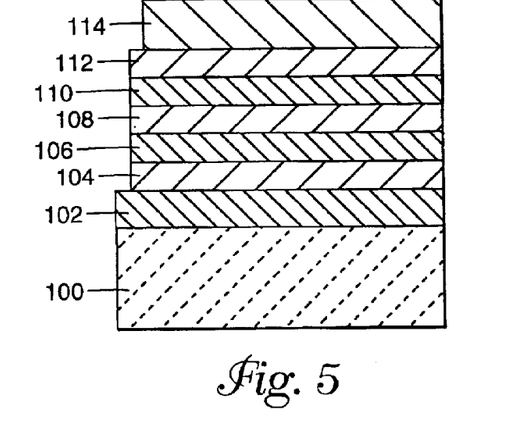
FIG. 5 illustrates a typical OLED construction without the encapsulating material of the present invention.

A conventional OLED construction without the encapsulating structure of the present invention is shown in FIG. 5.

Suitable OLED substrates 100 include glass, transparent plastics such as polyolefins, polyethersulfones, polycarbonates, polyester, polyarylates, and polymeric multilayer films, ITO coated barrier films such as the Plastic Film Conductor available from 3M Optical Systems Division, surface-treated films, and selected polyimides. It is highly desirable that the OLED substrate has barrier properties matching those of the protective (or counter electrode) film. Flexible rolls of glass may be use. Such a material may be laminated to a polymer carrier for better structural integrity.

The anode material 102 coating the substrate is electrically conductive and may be optically transparent or semi-transparent. Suitable anode materials include indium oxide, ITO, fluorine tin oxide (FTO), zinc oxide, vanadium oxide, zinc-tin oxide, gold, platinum, palladium silver, other high work function metals, and combinations thereof.

The lamp elements that may be deposited on the masked anode-coated substrate include an optional hole injecting layer 104, a hole transporting layer 106, a light emitting layer 108, an electron transporting layer 110, an optional electron injecting layer 112, and a second electrode (cathode) 114.

Suitable materials for the optional hole injecting layer 104, which accepts holes from the anode and transmits them to hole transporting layer, include porphyinic compounds, e.g., copper phthalocyanine (CuPc), zinc phthalocyanine, acid doped poly(ethylenedioxythiophene) (PEDOT), and acid doped polyaniline.

Suitable materials for the hole transporting layer 106, which facilitates the movement of holes from the anode layer 102 to the emitter layer 108, include, e.g., aromatic tertiary amine materials described in U.S. Pat. Nos. 5,374,489 and 5,756,224, (both incorporated by reference) such as 4,4',4"-tri(N-phenothiazinyl)triphenylamine (TPTTA), 4,4', 4"-tri(N-phenoxyazinyl)triphenylamine (TPOTA), N,N'-bis (3-methylphenyl)-N,N'-diphenyl benzidine (TPD), and polyvinyl carbazole.

Suitable materials for the emitter layer 108, in which the holes and electrons combine to produce light, include, e.g., tris(8-hydroxyquinolinato)aluminum (AlQ). The emission of light of different colors may be achieved by the use of different emitters and dopants in the emitter layer as described in the art (see C. H. Chen, J. Shi, and C. W. Tang "Recent Developments in Molecular Organic Electroluminescent Materials," *Macromolecular Symposia* 1997 125, 1–48).

Suitable materials for the electron transporting layer 110, which facilitates the movement of electrons from the cathode to the emitter layer, include, e.g., AlQ, bis(10-hydroxybenzo(h)quinolinato)beryllium, bis(2-(2-hydroxy-phenyl)-benzolthiazolato) zinc, 3,4,5-triphenyl-1,2,4-triazole, 2-(4-biphenylyl)-5-(4-t-butylphenyl)-1,3,4-oxadiazole, and combinations thereof.

Suitable materials for the optional electron injecting layer 112, which accept electrons from the cathode and transmit them to the electron transporting layer, include metal fluorides such as LiF, CsF, as well as $SiO_2$, $Al_2O_3$, copper phthalocyanine (CuPc), and alkaline metal compounds comprising at least one of Li, Rb, Cs, Na, and K such as alkaline metal oxides, alkaline metal salts, e.g., $Li_2O$, $Cs_2O$ and $LiAlO_2$.

Suitable materials for the cathode 114, which provides electrons, include, e.g., LiF, Mg, Ca, Ag, Al, Li, Ba, Yb, Sm, and other low work function metals, alloys of Ca and Mg, ITO, FTO, zinc oxide, and lithium.

Alternatively, one or more layers of light emitting polymers such as poly(phenylenevinylene)s (PPV), polyfluorenes, and other light emitting polymers known in the art may replace layers 106, 108, and 110.

Once all of the desired OLED elements have been deposited, the liner may be removed to provide a substrate with an OLED construction surrounded by adhesive. Subsequent covering or sealing of this coated substrate with a protective layer would provide an OLED that is edge-sealed and has enhanced structural (and environmental) stability. Alternatively, the cathode layer may comprise a sheet of material that is applied to the adhesive matrix after the preceding OLED element layers have been deposited and the release liner has been removed. If a sheet of cathode layer material is used, this cathode layer can also serve as a sealing layer that provides edge sealing of the OLED structure. In such a case, no additional protective layer would be necessary.

Figure 4:
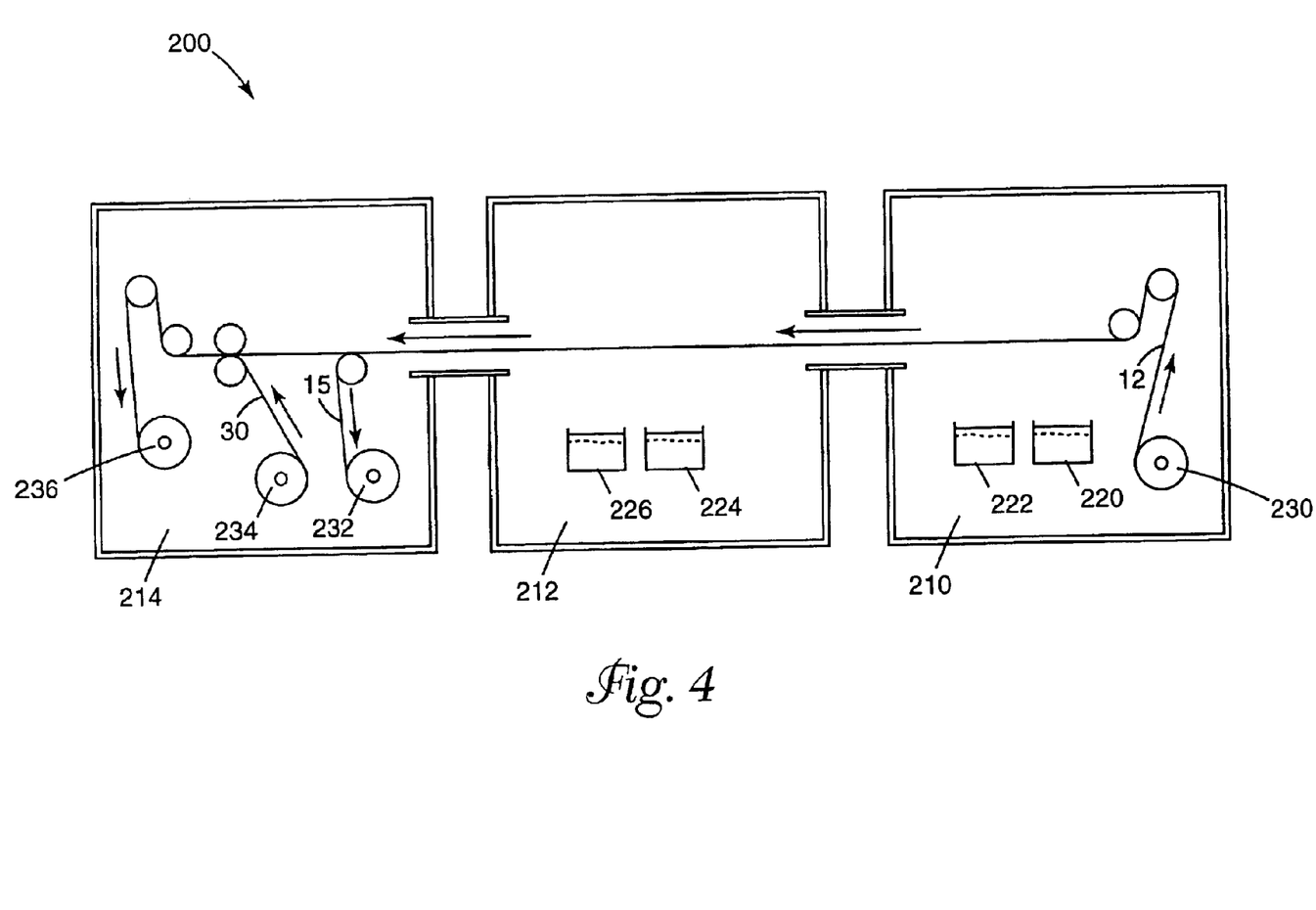
FIG. 4 illustrates a simplified representation of a vapor coating process that could be used in the present invention.

The process of the present invention could be readily carried out using a roll-to-roll continuous web process as illustrated by FIG. 4. For example, to prepare an OLED, a roll of flexible substrate 12 with precut adhesive-coated liner mask 14/15 could be fed from roll 230 into vacuum chamber 210 of coater 200 where OLED elements could be deposited by vaporization from deposition sources 220 and 222, which may deposit the first two organic layers of an OLED, corresponding, for example, to layers 104 and 106 of the device shown in FIG. 5. A deposition source (not shown in FIG. 5) could also furnish ITO anode layer 102 of FIG. 5. This step would be followed by a second set of vapor depositions in chamber 212 from deposition sources 224 and 226. Typically, deposition sources 220 to 226 will supply all of the layers necessary to produce a working OLED device on substrate 12. It will be obvious to one skilled in the art that the number of deposition sources in processing line 200 may vary according to the OLED device to be built. This step will be followed by removal of release liner 15 onto take-up roll 232 in take-up chamber 214 and application of sealing layer 30 from roll 234 onto exposed adhesive mask 14 to encapsulate and protect the OLED device. Sealing layer 30 may be a counter electrode or a protective layer, depending on the particular construction of the OLED device. Take-up chamber 214 can be under vacuum or can be at atmospheric pressure and filed with an inert atmosphere, such as argon or nitrogen. It will be obvious that the number of vacuum and take-up chambers may vary according to the desired set of process conditions. The finished sheet of OLED devices is then collected on take-up roll 236 from which it can be further dispensed for conversion into individual OLEDs by singulation, as shown in FIGS. 1–3. Other arrangements and combinations of applied layers are also possible and would be apparatus to one skilled in the art. The entire process could be carried out in a controlled atmosphere, such as under a vacuum or nitrogen, to minimize the possibility of environmental damage to the OLED. The finished sheet of OLEDs could be removed from the coater and converted to individual OLEDs by cutting through the adhesive-bonded areas of the electrode and substrate films to give the final (or at least partially) packaged OLED of the general structure shown in FIG. 3. Further encapsulation may also be done after fabrication. For example, after an electrode or protective layer is laminated to the OLED structure, an additional protective encapsulating layer may be added by, for example, dipping the entire assembly into a liquid epoxy resin and curing said resin by heat and/or light.

The roll-to-roll process maybe a solution process, a thermal transfer process, a vacuum process, or various combinations thereof. For example, a conducting polymer buffer layer, such as PEDOT, could be solution coated (knife coat, curtain coat, micro gravure coat, screen printed, etc.) onto an ITO deposition substrate 12 with the adhesive/liner mask 14/15 in place. After drying, the organic OLED layers and the cathode layers could be deposited by vacuum deposition in chambers 210 and 212 onto the moving web. Liner mask 15 would then be removed to take-up reel 232 and in its place protective layer 30 would be laminated to the newly formed ILED film to produce a roll of encapsulated OLED devices ready for singulation. Alternatively, OLED layers may be solution coated (knife coat, curtain coat, micro gravure coat, screen printed, etc.) onto an ITO deposition substrate with the adhesive/liner mask in place. After drying, the cathode layers may be deposited by vacuum deposition onto the moving web. The liner mask could be removed to a take-up reel and in its place a protective layer would be laminated to the newly formed OLED film to produce a roll of encapsulated OLED devices ready for singulation.

The roll-to-roll process may be done on a continuously moving web or its may be accomplished by a step-and-repeat roll-to-roll process. A step and repeated process could allow for more precise thickness control during the various vacuum deposition steps and could enable the use of more complex and finer featured shadow masks during the vacuum deposition steps. Different shadow masks could be easily moved in and out of position during the deposition of the various layers while still maintaining the convenience of a roll-to-roll process. Step-and-repeat web processing will likely be slower than continuous web processing. A web with sprocket holes along the edges may be advantageous in step-and-repeat and continuous web processing.

Figures 12, 12A:
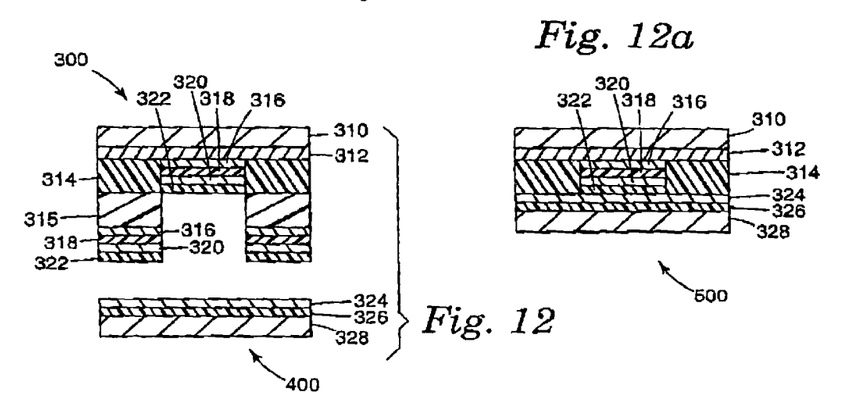
FIG. 12 and FIG. 12a illustrate an OLED constructed by laminating together two partial OLED structures, at least one of which is made by a method of the present invention.

The use of the in situ edge seal adhesive of the current invention can provide structural stability to OLEDs prepared by physical lamination of two substrates carrying the appropriate active layers. Although there are several ways to apply the current invention to the fabrication of OLEDs by lamination, only one will be exemplified herein. Such fabrication is illustrated by FIGS. 12 and 12a. For structure 300, adhesive/liner mask 314/315 may be placed on the metallized side of a polyester film 310 coated with aluminum 312 and placed into a vacuum deposition chamber. Approximately 5,000 Å of aluminum 316, 10 Å of LiF 318, 400 Å of AlQ 320, and 400 Å of 4,4'-bis(naphthalen-2-yl)-N-N-diphenyl benzidine ($\alpha$-NPD) 322 can be deposited in that order. Separately, for structure 400, polyester substrate 328 coated with ITO layer 326 can be coated with 1,000 Å of aqueous poly(ethylenedioxythiophene) (PEDOT) solution 324 and allowed to dry. Both film structures may be transferred to an inert atmosphere glove box. Liner 315 may be removed from structure 300, which structure 300 may then be laminated by heat and pressure to structure 400. Completed OLED device 500 would thus be formed where an interface between active layers 322 and 324, in this example between a hole injecting layer and a hole transport layer, would be created by physical lamination of these two layers. The completed device has improved structural stability by virtue of the adhesive forming the in situ edge seal around the device.

Finely patterned and addressable devices may be fabricated by the methods of the current invention. For example, a passively addressable monochrome dot matrix display may be fabricated in a roll-to-roll process. ITO on polyester could be patterned by a combination of standard photolithography and acid etching into columns that run across the web. An adhesive/liner mask which contains rectangular openings that define the desired area of the display would be applied to the web. Small molecule OLED layers would be vacuum deposited onto the web or light emitting polymers solution coated onto the web to essentially cover the rectangular openings in the adhesive/liner mask. Cathode metal would then be vapor deposited through a slotted mask to create rows of cathode metal parallel to the web direction. The liner would then be removed and a protective film laminated to the passive matrix display. Electrical connection to the anode would be simply made by contacting the columns of ITO that passes underneath the encapsulating adhesive. Electrical connection to the cathode rows could be made in a number of ways. The protective film laminated to the cathode side of the device could carry conductive traces that could be in registration with the rows of anode. These could be in physical contact with the cathode rows or could be attached by, for example, a Z-axis conductive adhesive film. Alternatively, the ITO substrate could be patterned to include ITO cathode contact pads, which pass underneath the encapsulating adhesive. The cathode rows can be contacted to these pads by, for example, the use of various deposition masks or by angle evaporation techniques.

This invention may also be useful to temporarily protect an OLED or a partial OLED device. Copending U.S. patent application Ser. No. 09/231,723 describes the use of OLED donor sheets to create OLED devices by thermal transfers. These donor sheets may benefit from protection from the atmosphere to increase their shelf life. An adhesive/liner mask could be applied to a donor substrate prior to the deposition of the desired OLED layers. The liner could be removed and a protective film could be applied before the donor sheets are exposed to oxygen or moisture. The protective film could be removed from the donor film immediately prior to thermally imaging the donor sheet thereby minimizing or eliminating the exposure of the donor sheet to oxygen and moisture. It would be preferred that the donor substrate also have good oxygen and moisture barrier properties.

Another unforseen advantage of the current invention is protection of the OLED and electrode layers from damage in a roll-to-roll process. The adhesive/liner mask will generally be thicker in the z direction than the various OLED and electrode layers. When the front face of the OLED film passes over various rollers in the web handling system required for a roll-to-roll process, the adhesive/liner mask can prevent or minimize the contact between the active OLED layers and these rollers. Furthermore, when the finished OLED film is wound up on the final take-up reel or "jumbo" roll, the adhesive/liner mask or the laminated protective film can prevent or minimize pressure induced damage to the OLED devices (or thermal donor films) as they are wound up on the final take-up reel.

It is also possible to establish electrical connections on the completed structure by removing some adhesive material from the outer edges of the OLED structure. When anode and cathode leads are in the form of ITO or other conductive paths that pass under the adhesive bond line, electrical connections to drive the devices are made by attaching the leads to a power supply or drive electronics. It may be desirable to remove portions of the protective layer and adhesive, which may cover these leads, to facilitate attachment of the power supply or drive electronics.

EXAMPLES

Unless otherwise specified, all chemicals were obtained from Eastman Kodak, Rochester, N.Y.

Example 1

FIGS. 6 and 7 show an ITO-coated glass substrate, 5 cm×7.6 cm×1 mm (Thin Film Devices, Inc., Anaheim, Calif.) 42. The ITO coating 44 was divided into two strips of conductive areas 46 and 48 by removing a portion of the ITO coating approximately 10 mm wide across the width of the glass substrate by acid-etching. In addition, ITO was removed along the outer lengths of the substrate such that strip 46 was wider than strip 48, as illustrated in FIG. 7. A portion of the substrate approximately 10 mm×20 mm that spanned portions of both ITO strips 46 and 48 was isolated by hand-laminating onto the substrate a piece of pressure-sensitive adhesive transfer tape (3M™ Ultra Pure Viscoelastic Damping Polymer 242F01, 3M Company, St. Paul, Minn.) 50 having a release liner on its upper side (not shown) from which a central hole area had been removed, to form a shape like a picture frame. The upper release liner of adhesive 50 remained in place. Glass substrate 42 was rinsed with methanol and dried under a nitrogen flow, then placed in a spin-coater, covered with xylene, and spun dry. An aqueous solution of poly(ethylenedioxythiophene) (PEDOT) conductive polymer (BAYTRON, Bayer Corp., Pittsburgh, Pa.) 52 was applied to the cut-out area, spun-coated at 5000 rpm for 20 seconds, then dried at 100° C. on a hot plate for 15 minutes. The coated slide was immediately placed in an evaporator vacuum chamber and the chamber was sealed and evacuated to approximately $10^{-5}$ torr. A light-emitting construction was prepared on the PEDOT surface by vacuum deposition, in the following order, of: 100 Å layer of copper phthalocyanine (CuPc), at 1 Å/sec; 200 Å 4,4'-bis(naphthalen-2-yl)-N,N'-diphenyl benzidine (α-NPD) hole transport layer, at 3 Å/sec; 350 Å trans(8-hydroxyquinolinato)aluminum (AlQ) doped at approximately 1% during the first 200 Å with a coumarin dye (C545T™) electron transport layer, at 2 Å/sec; 10 Å lithium fluoride, at 1 Å/sec; and 4000 Å aluminum, at 10 Å/sec, thereby creating organic thin films layer 54 and cathode layer 56.

In the vacuum chamber, organic layers 54 (CuPc, α-NPD, and AlQ and coumarin dye) were coated directionally from one end of the chamber and a LiF/aluminum cathode 56 from the opposite end of the chamber. Deposition of organic layers 54 was shaded on one end of the coated substrate by the sample holder (not shown), leaving portions of strips 46 and 48 uncoated. Deposition of LiF/aluminum cathode 56 from the opposite end of the chamber allowed some of the LiF and aluminum to be deposited on the uncoated portion of the ITO layer 48, providing an electrical contact.

The device was removed from the vacuum chamber and placed in a glove box under nitrogen. The upper liner was removed from the adhesive 'fame' 50 that surrounded the deposited lamp, and a clean glass cover slide 58 was pressed in place on the exposed adhesive, completely covering the lamp while leaving ITO strips 46 and 48 exposed on each end of the substrate. The covered device was removed from the glove box and tested by connecting an electrical power source to ITO strips 46 and 48. Light was emitted from the lamp when current was passed through the contacts.

Example 2

Figure 8:
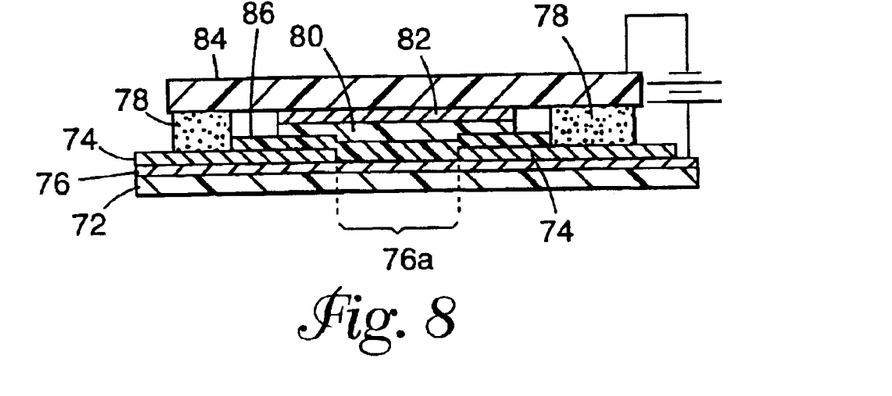
FIG. 8 illustrates a cross-sectional view of another OLED construction made using the present invention.
Figure 9:
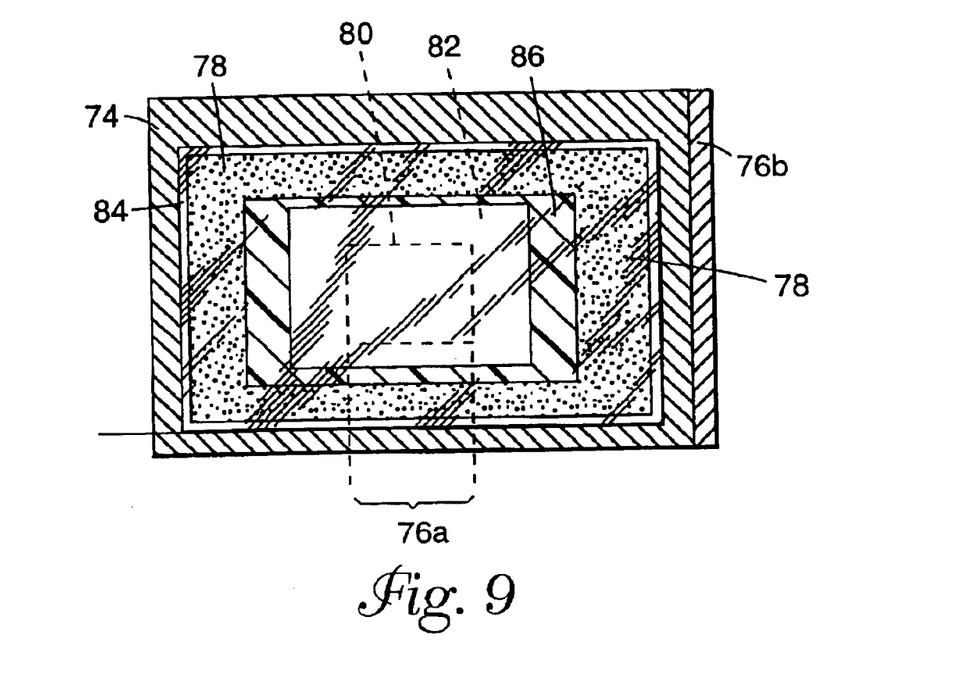
FIG. 9 illustrates a top view of the OLED of FIG. 8.

FIGS. 8 and 9 show an ITO-coated glass substrate, 5 cm×7.6 cm×1 mm (Thin Film Devices, Inc., Anaheim, Calif.) 72. Using standard electron beam evaporation methods, a layer of $Al_2O_3$ approximately 1000 μm thick 74 was deposited on the ITO 76 using a shadow masking method that left an approximately 10 mm×20 mm area of uncovered ITO 76a in the middle of substrate 72 and approximately 10 mm uncovered at one end of the substrate.

An electroluminescent lamp was constructed on the substrate as described in Example 1, wherein a portion of the $Al_2O_3$ surrounding the central ITO area was surrounded by a pressure-sensitive adhesive transfer tape 78, and a lamp was prepared in the interior isolated area by depositing PEDOT layer 86 and organic films layer 80 and aluminum anode layer 82. In the nitrogen glove box, the lamp was sealed by placing a sample of clean aluminum foil 84 on the exposed adhesive and in contact with the upper aluminum layer 82 of the lamp.

The device was removed from the glove box and tested by connecting an electrical power source to the aluminum foil encapsulating layer 82 (as the cathode) and to the uncovered ITO strip 76b at the end of the substrate (as the anode). Light was emitted from the lamp when current was passed through the contacts.

In the foregoing description, certain terms have been used for brevity, clarity, and understanding. No unnecessary limitations are to be implied therefrom beyond the requirement of the prior art because such terms are used for descriptive purpose and are intended to be broadly construed. Moreover, the description and illustration of the invention is by way of example, and the scope of the invention is not limited to the exact details shown or described.

What is claimed is:

1. An article comprising an organic electronic device which comprises:
   a. a substrate comprising glass;
   b. an adhesive;
   c. a multi-layer structure comprising one or more organic layers between an anode comprising indium tin oxide and a cathode, the anode, cathode or an organic layer having at least one outer edge and the organic layers comprising a hole transporting layer, a light emitting layer, and an electron transporting layer, the hole transporting layer comprising 4,4'-bis(naphthalen-2-yl)-N, N'-diphenyl benzidine, the light emitting layer comprising coumarin-doped tris(8-hydroxyquinolinato) aluminum, the electron transporting layer comprising bis(10-hydroxy-benzo(h)quinolinato) beryllium, bis(2-(2-hydroxy-phenyl)-benzolthiazolato) zinc, 3,4,5-triphenyl-1,2,4-triazole, or 2-(4-biphenylyl)-5-(4-t-butylphenyl)-1,3,4-oxadiazole, and the cathode comprising lithium fluoride and aluminum, and
   d. a sealing layer;
wherein the adhesive seals an outer edge of an organic layer and has an opening through the adhesive that surrounds the multi-layer structure.

2. An article comprising an organic electronic device which comprises:
   a. a substrate;
   b. an adhesive;
   c. a multi-layer structure comprising one or more organic layers between an anode and a cathode, the anode, cathode or an organic layer having at least one outer edge; and
   d. a sealing layer;
wherein the adhesive seals an outer edge of an organic layer and has an opening through the adhesive that surrounds the multi-layer structure, there is a gap between the multi-layer structure and the surrounding adhesive, and further comprising a desiccant in the gap.

3. An article comprising an organic electronic device which comprises:
   a. a roll of flexible substrate;
   b. a adhesive;
   c. a release liner; and d. a multi-layer structure comprising one or more organic layers between an anode and a cathode, the anode, cathode or an organic layer having at least one outer edge;

wherein the adhesive and release liner have a combined thickness greater than the multi-layer structure thickness, and protect the multi-layer structure from damage in a roll to roll manufacturing process; and wherein the adhesive has an opening through it that surrounds the multi-layer structure.

4. The article of claim 3 wherein the adhesive seals an outer edge of an anode or cathode.

5. The article of claim 3 wherein the adhesive seals an outer edge of an organic layer.

6. The article of claim 3 wherein the adhesive seals all outer edges of an organic layer.

7. The article of claim 3 wherein the adhesive seals all outer edges of the multi-layer structure.

8. The article of claim 3 wherein the adhesive and multi-layer structure have approximately equal thicknesses.

9. The article of claim 3 wherein the adhesive and release liner have complementary openings.

10. An organic electronic device precursor comprising:

a. a roll of flexible substrate comprising an electrode layer;

b. an adhesive;

c. a release liner; and d. one or more organic layers on the electrode layer, the organic layer or layers having at least one outer edge;

wherein the adhesive and release liner have a combined thickness greater than the thickness of the organic layer or layers, and protect the organic layer or layers from damage in a roll to roll manufacturing process; and wherein the adhesive has an opening through it that surrounds the organic layer or layers.

11. The precursor of claim 10 wherein the adhesive seals an outer edge of an electrode layer.

12. The precursor of claim 10 wherein the adhesive seals all outer edges of an organic layer.

13. The precursor of claim 10 wherein the adhesive seals all outer edges of all organic layers.

14. The precursor of claim 10 wherein the adhesive and the organic layer or layers have approximately equal thicknesses.

15. The precursor of claim 10 wherein the adhesive and release liner have complementary openings.

* * * * *

UNITED STATES PATENT AND TRADEMARK OFFICE
CERTIFICATE OF CORRECTION

PATENT NO. : 6,867,539 B1
DATED : March 15, 2005
INVENTOR(S) : McCormick, Fred B.

It is certified that error appears in the above-identified patent and that said Letters Patent is hereby corrected as shown below:

<u>Title page,</u>
Item [57], ABSTRACT,
Line 6, delete "linear" and insert -- liner -- therefor.

<u>Column 1,</u>
Line 66, delete "meal" and insert -- metal -- therefor.

<u>Column 3,</u>
Line 28, delete "electrode" and insert -- electrodes -- therefor.

<u>Column 5,</u>
Line 12, delete "OED" and insert -- OLED -- therefor.
Line 61, delete "adhesive" and insert -- adhesives -- therefor.

<u>Column 6,</u>
Line 2, delete "-Axis" and insert -- Z-Axis -- therefor.
Line 9, delete "adhesives" and insert -- adhesive -- therefor.

<u>Column 7,</u>
Line 53, delete "specified" and insert -- specific -- therefor.
Line 59, delete "lead" and insert -- leads -- therefor.

<u>Column 8,</u>
Line 46, delete "performed" and insert -- preferred -- therefor.
Line 57, delete "layer" and insert -- layers -- therefor.
Line 66, delete "polyester" and insert -- polyesters -- therefor.

<u>Column 9,</u>
Line 22, delete "porphyinic" and insert -- porphyrinic -- therefor.
Line 33, delete "N-phenoxyazinyl" and insert -- N-phenoxazinyl -- therefor.

UNITED STATES PATENT AND TRADEMARK OFFICE
CERTIFICATE OF CORRECTION

PATENT NO. : 6,867,539 B1
DATED : March 15, 2005
INVENTOR(S) : McCormick, Fred B.

It is certified that error appears in the above-identified patent and that said Letters Patent is hereby corrected as shown below:

Column 10,
Line 40, delete "filed" and insert -- filled -- therefor.
Line 48, delete "apparatus" and insert -- apparent -- therefor.
Line 54, delete "adhesive" and insert -- adhesively -- therefor.

Column 11,
Line 7, delete "ILED" and insert -- OLED -- therefor.

Column 13,
Line 48, delete "fame" and insert -- frame -- therefor.

Column 14,
Line 34, after "transporting" delete "layer," and insert -- layer; -- therefor.
Line 66, delete "a" and insert -- an -- therefor.

Signed and Sealed this

Fourteenth Day of June, 2005

JON W. DUDAS
*Director of the United States Patent and Trademark Office*